United States Patent
Kamath et al.

(10) Patent No.: US 6,680,243 B1
(45) Date of Patent: Jan. 20, 2004

(54) SHALLOW JUNCTION FORMATION

(75) Inventors: Arvind Kamath, Mountain View, CA (US); Rajiv L. Patel, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/897,517

(22) Filed: Jun. 29, 2001

(51) Int. Cl.$^7$ .................. H01L 21/425; H01L 21/336; H01L 21/76
(52) U.S. Cl. .................. 438/526; 438/294; 438/306; 438/407; 438/423; 438/527; 438/528; 438/766
(58) Field of Search ................ 438/526, 527, 438/528, 305, 373, 282

(56) References Cited

U.S. PATENT DOCUMENTS

| | | | | |
|---|---|---|---|---|
| 4,683,637 A | * | 8/1987 | Varker et al. | 438/294 |
| 5,489,790 A | * | 2/1996 | Lage | 257/330 |
| 5,668,021 A | * | 9/1997 | Subramanian et al. | 257/E29.054 |
| 5,674,760 A | * | 10/1997 | Hong | 438/297 |
| 5,712,173 A | * | 1/1998 | Liu et al. | 438/162 |
| 5,930,642 A | * | 7/1999 | Moore et al. | 438/407 |
| 6,100,148 A | * | 8/2000 | Gardner et al. | 257/E29.021 |

FOREIGN PATENT DOCUMENTS

| | | | | | |
|---|---|---|---|---|---|
| JP | 2001135821 A | * | 5/2001 | | H01L/29/786 |

* cited by examiner

*Primary Examiner*—Carl Whitehead, Jr.
*Assistant Examiner*—David L. Hogans
(74) *Attorney, Agent, or Firm*—Luedeka, Neely & Graham, PC

(57) ABSTRACT

A method for forming shallow junctions in a substrate. The substrate is masked with a first mask to selectively cover first portions of the substrate and selectively expose second portions of the substrate. A first dopant is implanted substantially within a first depth zone through the second portions of the substrate. The first depth zone extends from a first depth to a second depth, and the first depth is shallower than the second depth. The substrate is annealed for a first time to form a noncontiguous buried insulating layer substantially within the first depth zone in the second portions of the substrate. The substrate is masked with a second mask to selectively cover third portions of the substrate and selectively expose fourth portions of the substrate. The fourth portions of the substrate at least partially overlap the second portions of the substrate. A second dopant is implanted substantially within a second depth zone through the fourth portions of the substrate. The second depth zone extends from an upper surface of the substrate to the first depth. The substrate is annealed for a second time to activate the shallow junctions formed substantially within the second depth zone in the fourth portions of the substrate. The shallow junctions have a depth that is substantially limited by the noncontiguous buried insulating layer that starts at the first depth.

13 Claims, 2 Drawing Sheets

SHALLOW JUNCTION FORMATION

FIELD

This invention relates to the field of integrated circuit manufacturing. More particularly, the invention relates to shallow junction formation in integrated circuits.

BACKGROUND

One design goal for integrated circuits is to make the integrated circuit increasingly faster. One method of making an integrated circuit faster is to make it smaller. Thus, by creating increasingly smaller integrated circuits, not only can the design goal of faster integrated circuits be achieved, but the design goal of fitting more circuit elements within a given surface area can also be achieved.

Unfortunately, there are certain problems which arise as the geometries of integrated circuits are reduced. Some of these problems relate to conditions which tend to be inherent in the traditional designs of integrated circuits, but which conditions did not present a problem until the integrated circuits became smaller and faster.

For example, as integrated circuits become smaller in surface area, it is also generally necessary to make them shallower in depth. As the depth of the integrated circuits is decreased, some of the manufacturing processes that had traditionally been used to fabricate the integrated circuits became more difficult to control. For example, as junction depths for metal oxide semiconductor field effect transistors become shallower, it becomes harder to control the depth of the junction within a desired range, while achieving high dopant concentrations simultaneously.

Other problems also become more of an issue. For example, the junction capacitance to the substrate tends to create more problems as the integrated circuit operates at higher speeds and increased dopant activations. The junction capacitance tends to slow the integrated circuit because of the time delay that tends to be required to charge and discharge the effective capacitor that is formed due to coupling of the junction to the substrate.

What is needed, therefore, is a method for improving the switching speed of an integrated circuit by forming a controlled shallow junction with reduced junction capacitance.

SUMMARY

The above and other needs are met by a method for forming shallow junctions in a substrate. The substrate is masked with a first mask to selectively cover first portions of the substrate and selectively expose second portions of the substrate. A first dopant is implanted substantially within a first depth zone through the second portions of the substrate. The first depth zone extends from a first depth to a second depth, and the first depth is shallower than the second depth. The substrate is annealed for a first time to form a noncontiguous high quality buried insulating layer substantially within the first depth zone in the second portions of the substrate.

After undergoing a generally standard CMOS process flow, the substrate is masked with a second mask to selectively cover third portions of the substrate and selectively expose fourth portions of the substrate. The fourth portions of the substrate at least partially overlap the second portions of the substrate. A second dopant is implanted substantially within a second depth zone through the fourth portions of the substrate. The second depth zone extends from an upper surface of the substrate to the first depth.

The substrate is annealed for a second time to activate the shallow junctions formed substantially within the second depth zone in the fourth portions of the substrate. The shallow junctions have a depth that is substantially limited by the noncontiguous buried insulating layer that starts at the first depth.

By forming the noncontiguous buried insulating layer in the manner as described above, the shallow junctions are able to be formed to a fairly precisely determined and relatively shallow depth without spiking and shorting of the junctions. Thus, the speed of the integrated circuit incorporating the shallow junctions is enhanced. Further, by having the noncontiguous buried insulating layer under the shallow junctions, the substrate capacitance problems described above are substantially reduced. In addition, the noncontiguous buried insulating layer preferably does not substantially underlie a channel portion of the integrated circuit. Therefore, the substrate is preferably not electrically insulated from the channel portion of the integrated circuit, and majority carriers can be collected from the substrate when the channel portion of the integrated circuit is activated.

In various preferred embodiments of the method, the first dopant is one or more of oxygen, nitrogen, and argon. The second dopant is preferably one or more of indium, boron, phosphorous, and arsenic. The mask may be either a photoresist mask having properties that are compatible with the processing and functions as described herein, or a hard mask of a material such as silicon nitride or polysilicon, or other materials having properties that are compatible with the processing and functions as described herein.

The step of annealing the substrate for a first time is preferably conducted at a temperature of between about one thousand centigrade and about eleven hundred and fifty centigrade, and the first time is preferably between about one hour and about fifteen hours. The first depth is preferably, for example, about sixty nanometers and the second depth is about seventy nanometers. This is specific to technology generation and device design and must be considered guidelines. The fourth portions of the substrate are preferably wholly disposed within the second portions of the substrate.

In another aspect the invention provides for an integrated circuit having shallow junctions formed according to the method as described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
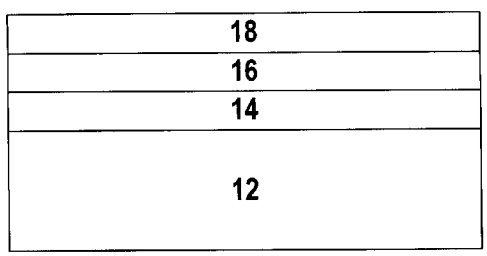
FIG. 1 is a cross sectional side view of a substrate with pad oxidation, hard mask, and photoresist layers.
Figure 2:
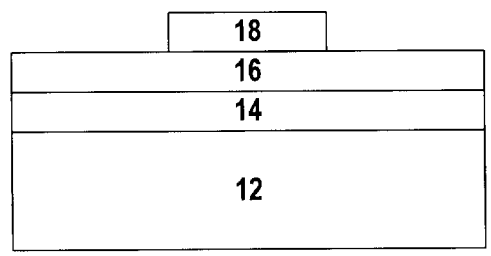
FIG. 2 is a cross sectional side view of the substrate where the photoresist layer has been patterned to expose the second portions of the substrate.

Referring now to FIG. 1 there is depicted an integrated circuit 10, which is in the process of manufacture. The integrated circuit 10 includes at this stage of processing a substrate 12, such as of a semiconducting material like silicon or germanium, a pad oxide layer 14, a hard mask layer 16, such as silicon nitride or polysilicon, and a photoresist layer 18. As depicted in FIG. 2, the photoresist layer 18 is patterned to cover first portions of the substrate 12 and expose second portions of the substrate 12. It is appreciated that although the substrate 12 may at this point in the processing be entirely covered by some of the layers, such as the pad oxide layer 14 and the hard mask layer 16, the designation of the substrate 12 being either covered or exposed is in reference to the particular layer in question, which at this point in the processing is the photoresist layer 18.

Figure 3:
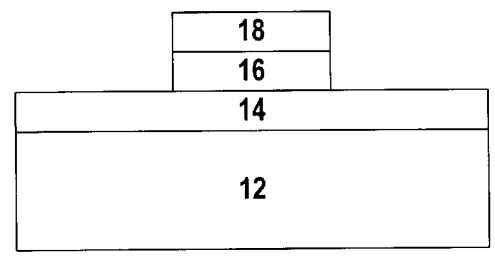
FIG. 3 is a cross sectional side view of the substrate where the hard mask has been patterned to expose the second portions of the substrate.
Figure 4:
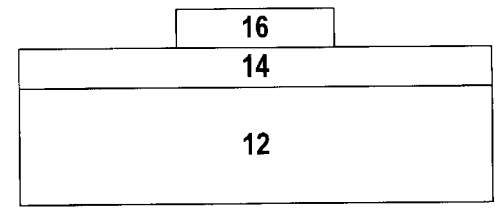
FIG. 4 is a cross sectional side view of the substrate where the photoresist has been removed from the patterned hard mask.

After patterning the photoresist layer 18 in the manner as described above, the hard mask layer 16 is etched, which also covers the substrate 12 in the first portions of the substrate 12 and exposes the substrate 12 in the second portions of the substrate 12, as depicted in FIG. 3. The photoresist layer 18 is preferably removed from the substrate 12, leaving behind the patterned hard mask layer 16, as depicted in FIG. 4. At this point in the processing of the integrated circuit 10, the hard mask layer 16 represents a dummy gate 16, the purpose of which is explained in more detail below.

Figure 5:
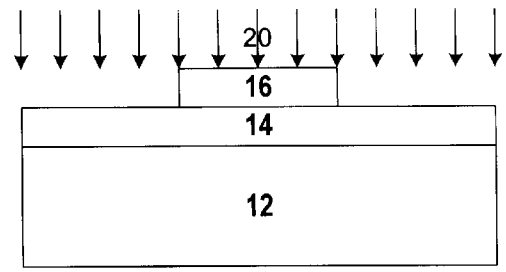
FIG. 5 is a cross sectional side view of the substrate receiving ion implantation into the second portions of the substrate, where the substrate is masked only by the hard mask.

The purpose of the dummy gate 16 is not to function as an actual gate structure in the completed integrated circuit 10, but to serve as a barrier or mask to a subsequent ion implantation process. Preferably, the dummy gate 16 substantially prohibits penetration of a first dopant 20 into the underlying substrate 12 in the first portions of the substrate 12, as depicted in FIG. 5. As explained in greater detail below, the first portions of the substrate 12 are generally the areas of the substrate 12 in which the gate electrode and channel areas of the integrated circuit 10 are to be formed at a later point in the processing. Therefore, selection of the material used for the hard mask 16, as well as the thickness of the hard mask 16, is dependent at least in part on the selection of the first dopant 20 and the ability of the hard mask 16 to resist bombardment by the ions of the first dopant 20.

Figure 6:
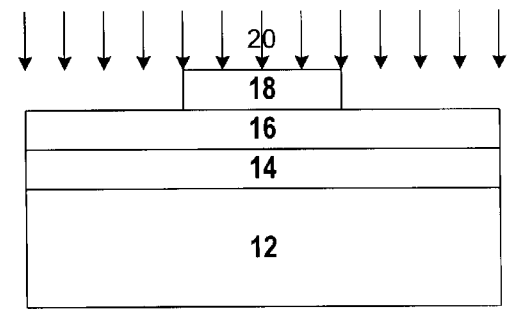
FIG. 6 is a cross sectional side view of the substrate receiving ion implantation into the second portions of the substrate, where the substrate is masked by both the photoresist layer and the hard mask.

The dummy gate 16 may also be formed from patterned and developed photoresist 16 in alternate embodiments of the method according to the present invention. In yet a further alternate embodiment, the hard mask 16 is not etched and the photoresist layer 18 is left in place while the first dopant 20 is implanted into the substrate 12, as depicted in FIG. 6. Thus, the present invention is not limited to the specific layers used to mask the substrate 12 from the first dopant 20. Therefore, it is appreciated that it is the function of the mask layers to substantially prohibit penetration of the first dopant 20 in the first portions of the substrate 12 which underlie the patterned areas of the mask that is important. However, it is preferred that the dummy gate 16 be formed of a hard mask by deposition of a layer of suitable material such as silicon nitride or polysilicon, followed by the patterning and etching as described above.

Figure 7:
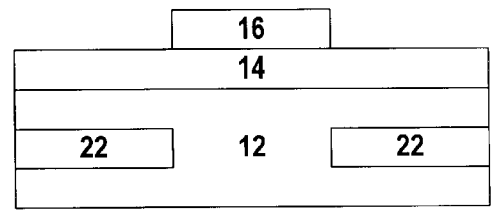
FIG. 7 is a cross sectional side view of the substrate where the noncontiguous buried insulating layer has been formed within the first depth zone.

The first dopant 20 differs significantly from the species that are typically selected for ion implantation at this stage of the processing of the integrated circuit 10. Whereas ion implantation is typically used to impregnate the substrate 12 with a species such as boron or phosphorus that increases the conductive properties of the substrate 12, the first dopant 20 is a species which, upon appropriate annealing, forms a noncontiguous buried insulating layer 22 within the substrate 12, as depicted in FIG. 7. The noncontiguous buried insulating layer 22 is noncontiguous in that it is formed in the second portions of the substrate 12 which were exposed in the masking process described above, and does not extend into the first portions of the substrate 12 which were covered in the masking process described above.

The noncontiguous buried insulating layer 22 is buried in that it is formed at a first depth zone within the second portions of the substrate 12. The first depth zone preferably extends from a first depth of about sixty nanometers to a second depth of about seventy nanometers. Thus, the noncontiguous buried insulating layer 22 is initially formed in a region of the substrate 12 that is buried within the substrate 12.

As briefly introduced above, the noncontiguous buried insulating layer 22 is designated as insulating because of the peculiar nature of the first dopant 20 that is selected for implantation, and the peculiar function which the noncontiguous buried insulating layer 22 eventually provides to the integrated circuit 10. These functions are described in more detail below. Preferably the first dopant species 20 is selected from the group consisting of oxygen, nitrogen, and argon. Most preferably the first dopant is oxygen.

Following the implantation of the first dopant 20, it is preferred that the masking layers, including the photoresist layer 18 if still present, and the dummy gate 16 or the entire hard mask 16 be removed from the substrate 12. The substrate 12 is thereafter subjected to a first anneal. The first anneal is preferably done to both repair damage done to the crystalline structure of the substrate 12 caused by the penetration of the first dopant 20 into the substrate 12 and to promote reaction of the first dopant 20 with the material of the substrate 12 within the first depth zone to form the noncontiguous buried insulating layer 22.

For example, if the first dopant 20 is oxygen and the substrate 12 is silicon, then the anneal tends to form silicon dioxide within the substrate 12. In order to promote reaction between the first dopant 20 and the substrate 12, the first anneal is preferably conducted for a first time of between about one hour and about fifteen hours, and at a temperature of between about one thousand centigrade and about eleven hundred and fifty centigrade. Although the preferred embodiment forms an insulating oxide as the noncontiguous buried insulating layer 22, in alternate embodiments other species, such as those described above, are impregnated substantially with the first depth zone at a concentration such that portions of the substrate 12 above the noncontiguous buried insulating layer 22 are electrically insulated from portions of the substrate 12 below the noncontiguous buried insulating layer 22, even though the noncontiguous buried insulating layer 22 is not formed of an oxide. For example, if nitrogen is used as the first dopant 20 and the substrate 12 is silicon, then the noncontiguous buried insulating layer 22 is preferably formed of silicon nitride. However, if argon is the first dopant 20, then a chemical reaction with the substrate 12 probably does not occur. Still, by controlling the amount of argon implanted, the noncontiguous buried insulating layer 22 can preferably be made substantially electrically insulating.

Figure 8:
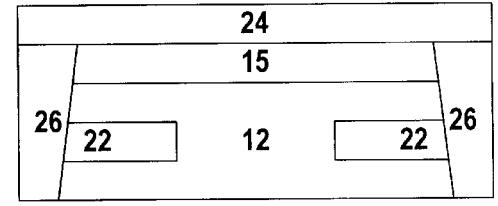
FIG. 8 is a cross sectional side view of the substrate where the hard mask and pad oxide layer have been removed and isolation structures, gate oxide, and gate electrode layers have been formed (pad oxide/nitride formed afresh if necessary—optional)
Figure 9:
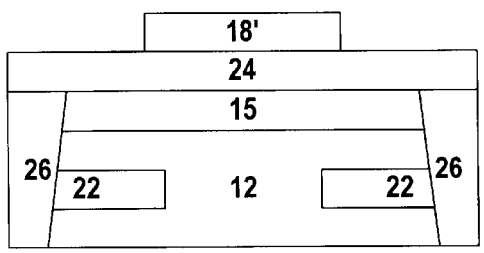
FIG. 9 is a cross sectional side view of the substrate where a photoresist layer has been patterned to expose the fourth portions of the substrate.
Figure 10:
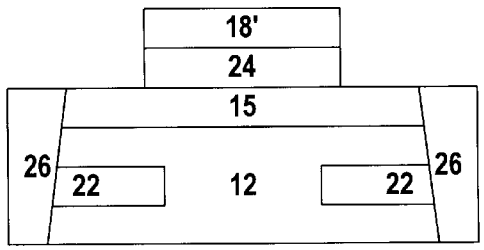
FIG. 10 is a cross sectional side view of the substrate where the gate electrode layer has been patterned to expose the fourth portions of the substrate.

The pad oxide layer 14 is removed, either before or after the anneal as described above is performed, and isolation structures 26, gate oxide layer 15, and gate electrode layer 24 are formed, as depicted in FIG. 8, preferably after the anneal is performed. The substrate 12 is masked, such as with photoresist layer 18', to cover third portions of the substrate 12 and expose fourth portions of the substrate 12, as depicted in FIG. 9. Most preferably, the photoresist layer 18' is used to etch and pattern the gate electrode 24, as depicted in FIG. 10, which gate electrode 24 is most preferably formed of polysilicon.

The gate electrode 24, disposed over the third portion of the substrate 12, is positioned in generally the same location on the substrate 12 as the dummy gate 16. However, the gate electrode 24 is preferably somewhat larger in its critical dimension than the dummy gate 16. In other words, the gate electrode 24 extends farther towards the outside edges of the integrated circuit 10, towards the isolation structures 26, than did the dummy gate 16. Therefore, as can be seen in FIG. 11, the gate electrode 24 in the third portion of the substrate 12 overlaps to some degree the noncontiguous buried insulation layer 22 in the second portion of the substrate 12.

Stated in another way, the fourth portion of the substrate 12 that is left exposed by the photoresist layer 18' and the gate electrode 24, is somewhat smaller in surface area than the second portion of the substrate 12 that was left exposed by the photoresist layer 18 and the hard mask 16. In a most preferred embodiment, there is no portion of the fourth portion of the substrate 12 that extends past an outer horizontal boundary of the second portion of the substrate 12. Thus, the gate electrode 24 preferably overlaps portions of the noncontiguous buried insulating layer 22 by about one one-hundredth of a micron. This value is very specific to the technology used, and is a representative value for 0.09 micron technology.

Figure 11:
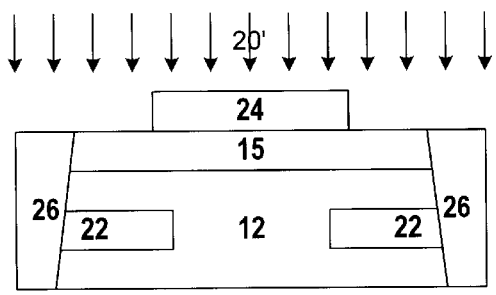
FIG. 11 is a cross sectional side view of the substrate receiving ion implantation into the fourth portions of the substrate to form the source and drain junctions.
Figure 12:
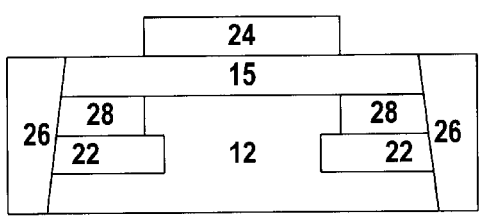
FIG. 12 is a cross sectional side view of the substrate where the shallow junctions have been formed within the second depth zone.

A second dopant 20' is implanted in the fourth portions of the substrate 12, as depicted in FIG. 11. The second dopant 20' is implanted substantially within a second depth zone 28 as depicted in FIG. 12, which second depth zone 28 is shallower than the first depth zone 22 at which the first dopant 20 was implanted. This second depth zone 28 preferably extends from about the upper surface of the substrate 12 to about the first depth which is the upper boundary of the first depth zone 22, and also substantially the upper boundary of the noncontiguous buried insulating layer 22.

The second dopant 20' is chosen to improve the conductive properties of the fourth portion of the substrate 12 in which it is implanted, and is typically selected as either a p type dopant or an n type dopant. Thus, the second dopant 20' may be a species such as indium, boron, phosphorus, or arsenic. After the second dopant 20' is implanted, the substrate 12 is given a second anneal to activate the implanted second dopant 20', which forms the shallow junctions 28 within the fourth portion of the substrate 12, as depicted in FIG. 12. The shallow junctions 28 preferably represent source drain areas of the integrated circuit 10, and are formed substantially within the second depth zone of the substrate 12.

The method thus provides an integrated circuit 10 with a noncontiguous buried insulating layer 22 selectively provided below the source drain areas 28 of the integrated circuit 10. Moreover, it is appreciated that because the dummy gate 16 originally applied to the substrate 12 is somewhat smaller than the gate electrode 24 of the integrated circuit 10, the area implanted with the first dopant 20 is correspondingly somewhat larger than the area implanted with the second dopant 20'. Thus, the noncontiguous buried insulating layer 22 within the first depth zone extends somewhat beyond the source drain areas 28 within the second depth zone.

Integrated circuits 10 formed according to the preferred method of the present invention exhibit marked advantages over integrated circuits formed without the noncontiguous buried insulating layer 22. The presence of the noncontiguous buried insulating layer 22 automatically limits the depth of the shallow junctions 28 formed by the implantation of the second dopant 20' and subsequent annealing. Thus, the shallow junctions formed have a shallower and more well defined structure. Moreover, because the noncontiguous buried insulating layer 22 limits penetration of the second dopant 20', a higher concentration of the second dopant 20' may be implanted at the shallower depth of the second depth zone, providing improved conductivity in the source drain areas 28, without extending the depth of the source drain areas 28 down into the substrate 12.

The present invention provides additional advantages over conventional silicon on oxide processes, in which a contiguous insulating layer is formed below all of the active areas of an integrated circuit. When an insulating layer completely underlies the channel portions of the integrated circuit, carriers from the substrate cannot be collected when the channel areas are activated, and insufficient carriers may be available to carry the desired current, resulting in what has been called a kink effect. However, by forming the noncontiguous buried insulating layer 22 substantially beneath the source drain areas 28, and substantially not beneath the channel area of the integrated circuit 10, carriers are available to the channel area from the substrate 12, and the kink effect is greatly reduced.

Figure 13:
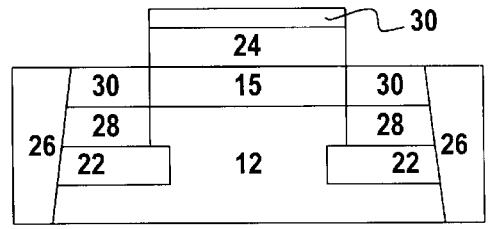
FIG. 13 is a cross sectional side view of the substrate where silicide contacts have been formed.

Most preferably, silicide layers 30 are formed above the gate electrode 24 and the source drain areas 28, as depicted in FIG. 13. The silicide layers 30 are formed such as by deposition of a metal layer on the upper surfaces of the gate electrode 24 and the source drain areas 28, followed by an anneal to react the deposited metal with the material of the substrate 12 and the gate electrode 24. In the specific case where the substrate 12 is formed of silicon and the gate electrode 24 is formed of polysilicon, the process forms a metal silicide 30. The material deposited as a precursor to the silicide 30 may be a metal such as titanium, cobalt, nickel, or tantalum.

The noncontiguous buried insulation layer 22 provides another benefit in regard to the silicidation process described above. Typically, the silicidation process must be very carefully monitored so that the silicide 30 formed does not consume the entire thickness of the source drain areas 28. If this happens, then the source drain areas 28 do not function in a preferred manner as they tend to punch through, shorting the junction. This situation is especially prevalent when the source drain areas 28 are formed as relatively shallow junctions, which as mentioned above, is one of the design goals for faster integrated circuits 10, and one of the benefits of the present invention. However, the noncontiguous buried insulating layer 22 preferably completely underlies the source drain areas 28. Therefore, the noncontiguous buried insulating layer 22 substantially prohibits the silicide 30 from growing past the first depth or through the first depth zone, and prevents spiking problems with the silicide 30.

Thus, the invention provides for a relatively greater depth of silicide 30 to be formed without the associated problems as described above, since the presence of the noncontiguous buried insulating layer 22 prevents the problems described above. This tends to reduce the series resistance of the circuit, which tends to increase the drivability of the circuit, making higher currents possible. As also described above, the present invention tends to reduce the substrate capacitance problem by electrically isolating the source drain areas 28 from the substrate 12 with the noncontiguous buried insulating layer 22.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for forming shallow junctions in an integrated circuit in a substrate comprising:
    masking the substrate with a first mask to selectively cover first portions of the substrate and selectively expose second portions of the substrate,
    prior to formation of a gate electrode layer, implanting a first dopant substantially within a first depth zone through the second portions of the substrate, where the first depth zone extends from a first depth to a second depth, and the first depth is shallower than the second depth,
    substantially removing the first mask from the substrate,
    annealing the substrate for a first time to form a noncontiguous buried insulating layer substantially within the first depth zone in the second portions of the substrate,
    forming a gate electrode layer on the substrate
    masking the substrate with a second mask to selectively cover third portions of the substrate and selectively expose fourth portions of the substrate, where the fourth portions of the substrate at least partially overlap the second portions of the substrate,
    implanting a second dopant substantially within a second depth zone through the fourth portions of the substrate, where the second depth zone extends from an upper surface of the substrate to the first depth, and
    annealing the substrate for a second time to activate the shallow junctions formed substantially within the second depth zone in the fourth portions of the substrate, where the shallow junctions have a depth that is substantially limited by the noncontiguous buried insulating layer that starts at the first depth.

2. The method of claim 1 wherein the second portions of the substrate do not substantially underlie a channel portion of the integrated circuit.

3. The method of claim 1 wherein the first dopant is selected from a group consisting of oxygen, nitrogen, and argon.

4. The method of claim 1 wherein the second dopant is selected from the group consisting of indium, boron, phosphorus, and arsenic.

5. The method of claim 1 wherein the first mask further comprises a photoresist mask.

6. The method of claim 1 wherein the first mask further comprises a hard mask.

7. The method of claim 1 wherein the step of annealing the substrate for a first time is conducted at a temperature of between about one thousand centigrade and about eleven hundred and fifty centigrade and the first time is between about one hour and about fifteen hours.

8. The method of claim 1 wherein the first depth is about sixty nanometers.

9. The method of claim 1 wherein the second depth is about seventy nanometers.

10. The method of claim 1 further comprising the steps of depositing a metal in the fourth portions of the substrate and heating the substrate to form a silicide in the fourth portions of the substrate.

11. The method of claim 1 wherein the fourth portions of the substrate are wholly disposed within the second portions of the substrate.

12. The method of claim 1 wherein the fourth portions of the substrate form a plurality of source drain areas.

13. A method for forming shallow junctions in an integrated circuit in a substrate comprising the sequential steps of:
    masking the substrate with a first mask to selectively cover first portions of the substrate and selectively expose second portions of the substrate,
    prior to formation of a gate electrode layer, implanting a first dopant substantially within a first depth zone through the second portions of the substrate, where the first depth zone extends from a first depth to a second depth, and the first depth is shallower than the second depth,
    annealing the substrate for a first time to form a noncontiguous buried insulating layer substantially within the first depth zone in the second portions of the substrate,
    substantially removing the first mask from the substrate,
    forming a gate electrode layer on the substrate,
    masking the substrate with a second mask to selectively cover third portions of the substrate and selectively expose fourth portions of the substrate, where the fourth portions of the substrate at least partially overlap the second portions of the substrate,
    implanting a second dopant substantially within a second depth zone through the fourth portions of the substrate, where the second depth zone extends from an upper surface of the substrate to the first depth, and annealing the substrate for a second time to activate the shallow junctions formed substantially within the second depth zone in the fourth portions of the substrate, where the shallow junctions have a depth that is substantially limited by the noncontiguous buried insulating layer that starts at the first depth.

* * * * *